US012153086B2

(12) United States Patent
Roberts et al.

(10) Patent No.: US 12,153,086 B2
(45) Date of Patent: Nov. 26, 2024

(54) SYSTEM AND METHOD TO FIX MIN-DELAY VIOLATION POST FABRICATION

(71) Applicant: Microchip Technology Incorporated, Chandler, AZ (US)

(72) Inventors: David Roberts, Gilbert, AZ (US); Jeremy Nall, Phoenix, AZ (US); Kazi Naisur Rahman, Chandler, AZ (US); Ray Nassim, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 149 days.

(21) Appl. No.: 18/105,734

(22) Filed: Feb. 3, 2023

(65) Prior Publication Data

US 2023/0251307 A1 Aug. 10, 2023

Related U.S. Application Data

(60) Provisional application No. 63/307,098, filed on Feb. 5, 2022.

(51) Int. Cl.
*G01R 31/28* (2006.01)
*H03K 3/037* (2006.01)
*H03K 5/01* (2006.01)
*H03K 5/00* (2006.01)

(52) U.S. Cl.
CPC ......... *G01R 31/2882* (2013.01); *H03K 3/037* (2013.01); *H03K 5/01* (2013.01); *H03K 2005/00078* (2013.01)

(58) Field of Classification Search
CPC .......... G01R 31/2882; G01R 31/31725; G01R 31/31727; H03K 3/037; H03K 5/01; H03K 2005/00078
USPC ............................ 324/762.01, 536, 512, 500
See application file for complete search history.

(56) References Cited

U.S. PATENT DOCUMENTS

| 9,760,672 | B1 | 9/2017 | Taneja et al. |
| 12,032,019 | B2* | 7/2024 | Kim ................. G01R 31/31924 |
| 2007/0076830 | A1 | 4/2007 | Hasan et al. .................. 375/354 |
| 2008/0024181 | A1 | 1/2008 | Wada ............................ 327/161 |
| 2015/0277393 | A1* | 10/2015 | Liu ......................... H03K 5/01 |
| | | | 324/750.01 |

(Continued)

OTHER PUBLICATIONS

Partial International Search Report and Written Opinion, Application No. PCT/US2023/012381, 19 pages.

(Continued)

*Primary Examiner* — Giovanni Astacio-Oquendo
(74) *Attorney, Agent, or Firm* — SLAYDEN GRUBERT BEARD PLLC

(57) ABSTRACT

A system and method of testing an integrated circuit provide a first clock signal to a first flip-flop with an output to a functional circuit, provide a second clock signal to a second flip-flop with an input from the functional circuit, wherein the second flip-flop has a minimum hold time, provide a test input to the first flip-flop, observe a signal propagation time through the functional circuit, determine the signal propagation time is less than the minimum hold time of the second flip-flop, and increasing a timing separation by adding a unit of delay to the first clock signal or subtracting a unit of delay from the second clock signal.

20 Claims, 7 Drawing Sheets

(56) References Cited

U.S. PATENT DOCUMENTS

2023/0168708 A1* 6/2023 Jain ........................ H03L 7/00
326/93

OTHER PUBLICATIONS

International Search Report and Written Opinion, Application No. PCT/US2023/012381, 27 pages.

* cited by examiner

SYSTEM AND METHOD TO FIX MIN-DELAY VIOLATION POST FABRICATION

RELATED APPLICATION

This application claims priority to commonly owned U.S. Provisional Patent Application No. 63/307,098, filed on Feb. 5, 2022, which is hereby incorporated by reference.

FIELD OF THE INVENTION

The present application relates to post fabrication validation of integrated circuits.

BACKGROUND

Integrated circuits (ICs) are commonly tested after fabrication to ensure operability under normal and extreme conditions. ICs that only have setup violations may be downrated and sold as lower performing parts. However, ICs with even one hold violation must be discarded.

SUMMARY

In some examples, a method of testing an integrated circuit is provided comprising providing a first clock signal to a first flip-flop, the first flip-flop with an output to a functional circuit, providing a second clock signal to a second flip-flop, the second flip-flop with an input from the functional circuit, wherein the second flip-flop has a minimum hold time, providing a test input to the first flip-flop, observing a signal propagation time through the functional circuit, determining the signal propagation time is less than the minimum hold time of the second flip-flop, and increasing a timing separation in response to the determining that the signal propagation time is less than the minimum hold time of the second flip-flop by adding a unit of delay to the first clock signal or subtracting a unit of delay from the second clock signal. In certain examples, the method comprises, after adding the unit of delay to the first clock signal observing a second time the signal propagation time through the functional circuit, determining the second signal propagation delay is less than the minimum hold time of the second flip-flop, and adding a second unit of delay to the first clock signal. In certain examples, the method comprises determining the timing separation cannot be increased further, and marking the integrated circuit to be discarded. In certain examples, the method comprises storing the unit of delay in a nonvolatile memory. In certain examples, the functional circuit is a combinational logic path through a pipeline stage of a processor and the method comprises conducting a static timing analysis of the pipeline stage and identifying the functional circuit as having the fastest signal propagation time of any path through the pipeline stage. In certain examples, the method comprises generating a first delayed clock signal by passing a master clock signal through a first delay circuit, and generating a second delayed clock signal by passing a master clock signal through a second delay circuit, wherein adding a unit of delay to the first clock signal includes selecting the first delayed clock signal as the first clock signal. In certain examples, the second flip-flop has a minimum setup time, the method comprises after increasing the timing separation, observing a setup violation in the second flip-flop, and downgrading a maximum frequency of the integrated circuit.

In some examples, a system for testing an integrated circuit is provided comprising a first clock signal line to a first flip-flop having an output to a functional circuit, a second clock signal to a second flip-flop with an input from the function, wherein the second flip-flip has a minimum hold time, a test circuit coupled to an input of the first flip-flop and the output of the functional circuit to determine if a signal has propagated through the function in a first propagation time that is less than the minimum hold time of the second flip-flop, and a first delay selection circuit coupled between a master clock signal line and the first clock signal line to selectively add or subtract a unit of delay, and a second delay selection circuit coupled between a master clock signal line and the second clock signal line. In certain examples, the delay selection circuit to selectively add two units of delay to the first clock signal. In certain examples, the test circuit comprises a timer having a start input coupled to the first clock signal line and a stop input coupled to the output of the functional circuit. In certain examples, the integrated circuit comprises a nonvolatile memory coupled to the delay selection circuit to store a unit delay count. In certain examples, the functional circuit is a combinational logic path through a pipeline stage of a processor. In certain examples, the delay selection circuit comprises a one-unit clock delay buffer coupled to the master clock signal line, a two-unit clock delay buffer coupled to the master clock signal line, and a selector with an output coupled to the first clock signal line and a plurality of inputs coupled to each of the master clock signal, an output of the one-unit clock delay buffer, and an output of the two-unit clock delay buffer. In some examples, the test circuit comprises a timer to determine a signal propagation delay, an adder to add a minimum setup time of the second flip-flop, and a comparator to signal an unfixable condition when the signal propagation delay plus the minimum setup time of the second flip-flop is greater than a cycle time of a clock signal on the second clock line.

In some examples, an integrated circuit comprises a first clock signal line to a first flip-flop having an output to a functional circuit, a second clock signal to a second flip-flop with an input from the function, wherein the second flip-flip has a minimum hold time, a nontransitory memory to store a delay quantity, a first delay circuit coupling a master clock signal line to the first clock signal line to produce a first clock signal by delaying the master clock signal an amount specified by the delay quantity, and a second delay circuit coupling a master clock signal line to the second clock signal line. In certain examples, the nontransitory memory is nonvolatile. In certain examples, the functional circuit is a combinational logic path through a pipeline stage of a processor. In certain examples, the first delay circuit comprises a one-unit clock delay buffer coupled to the master clock signal line, a two-unit clock delay buffer coupled to the master clock signal line, and a selector with an output coupled to the first clock signal line and a plurality of inputs coupled to each of the master clock signal, an output of the one-unit clock delay buffer, and an output of the two-unit clock delay buffer. In certain examples, the integrated circuit comprises a delay selection circuit coupled between the master clock signal line and the clock signal line at each pipeline stage of the processor. In certain examples, the delay circuit comprises a first clock delay buffer coupled to the master clock signal line and an intermediate line, a second clock delay buffer coupled to the first intermediate line and a second line, a selector with an output coupled to the first clock signal line and a first input coupled to the master clock signal line, a second input coupled to the intermediate line, and a third input coupled to the second line.

DETAILED DESCRIPTION

Figure 1:
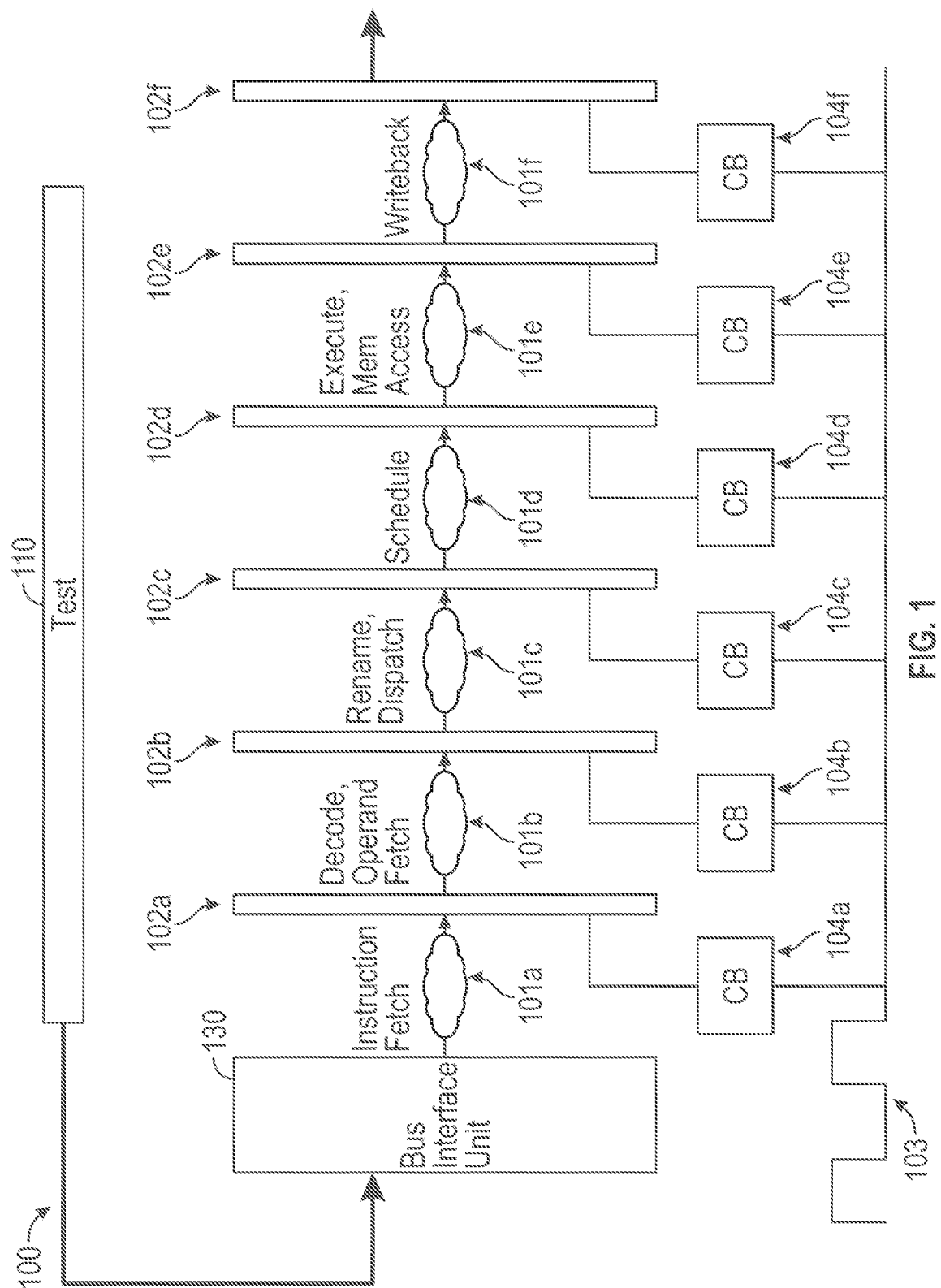
FIG. 1 is an illustration of an integrated circuit with controllable clock delay, according to examples of the present disclosure.

FIG. 1 is an illustration of an integrated circuit with controllable clock delay, according to examples of the present disclosure. Integrated circuit 100 may be a pipelined processor with bus interface unit 130, function circuits 101a-101f followed by respective flip-flops 102 (illustrated as flip-flops 102a, 102b, 102c, 102d, 102e, and 102f) forming the boundary between respective pipeline stages. Bus interface unit 130 provides an interface to a memory storing instructions to be executed by the processor. Timing for integrated circuit 100 is driven by a master clock signal carried along master clock signal line 103 fed through respective clock buffers 104 (illustrated as clock buffers 104a, 104b, 104c, 104d, 104e, and 104f) to individual clock signal lines coupled to corresponding flip-flops 102. In some examples, all flip-flops 102 in a given stage are driven by the same clock buffer, e.g., clock buffer 104a drives a plurality of flipflops in 102a in the respective pipeline stage. Flip-flops 102 are single bit memories arranged in an array to capture the results of a pipeline stage at each predetermined clock transition. Flip-flops 102a, for example, may be an array of flip-flops storing a processor instruction, for example a 32-bit reduced instruction set instruction. Flip-flops 102b, for example, may store an operand value (e.g., a 32-bit value retrieved from a memory) along with decoded instruction information. Work done in the function units of each pipeline stage is propagated to the next stage when triggered by, for example, the rising edge of the clock signal. Values propagate along various paths in the functional unit and some paths may be "shorter" meaning that a value on one path may propagate faster than a value on another path. In an unrealistically simple adder implementation, the least significant bit (LSB) of the sum may arrive at flip-flip 102e substantially sooner than the most significant bit (MSB) of the sum because any carried values must propagate from the LSB to the next bit and so forth until it reaches the MSB. Circuits must be timed to ensure the critical path signal (i.e., the slowest propagating signal) is computed, and valid, before the next clock cycle to ensure it is available to be read into the corresponding flip-flop before the next clock trigger. Circuits must also be timed to ensure that the fastest propagating signals do not switch before the prior result is captured by the output flip-flop.

Each flip-flop has two timing requirements. First, each flip-flop has a minimum setup time, which is the amount of time the input signal must remain stable before the clock trigger. Second, each flip-flop has a minimum hold time, which is the amount of time the input signal must remain stable after the clock trigger. If either requirement fails, the flip-flop may not capture the input signal. The bank of flip-flops at each stage is typically timed together and driven by a respective clock buffer assigned to that bank.

Clock buffers 104 incorporate selectable delay circuitry to allow timing adjustments. If a signal propagation of a given execution stage is longer than designed or longer than expected, the clock buffers controlling the flip-flops preceding and/or following the stage may be adjusted to ensure all signals are stable before the min-setup time. Test circuit 110 generates test patterns and observes functional unit outputs to determine whether a clock buffer delay adjustment is needed. In some examples, test circuit 110 may simulate bus interface unit 130 to provide a fetched instruction. In some examples, test circuit 110 may set values directly in one or more of flip-flops 102a-102e. In some examples, test circuit 110 may observe the functional unit output as well as the output of the flip-flop receiving the functional unit output. In these examples, if test circuit 110 observes a change in the functional unit output but does not observe a corresponding change in the receiving flip-flop, test circuit 110 may determine that the timing was incorrect and adjust the clock buffer delay before and/or after the functional unit.

Figure 2:
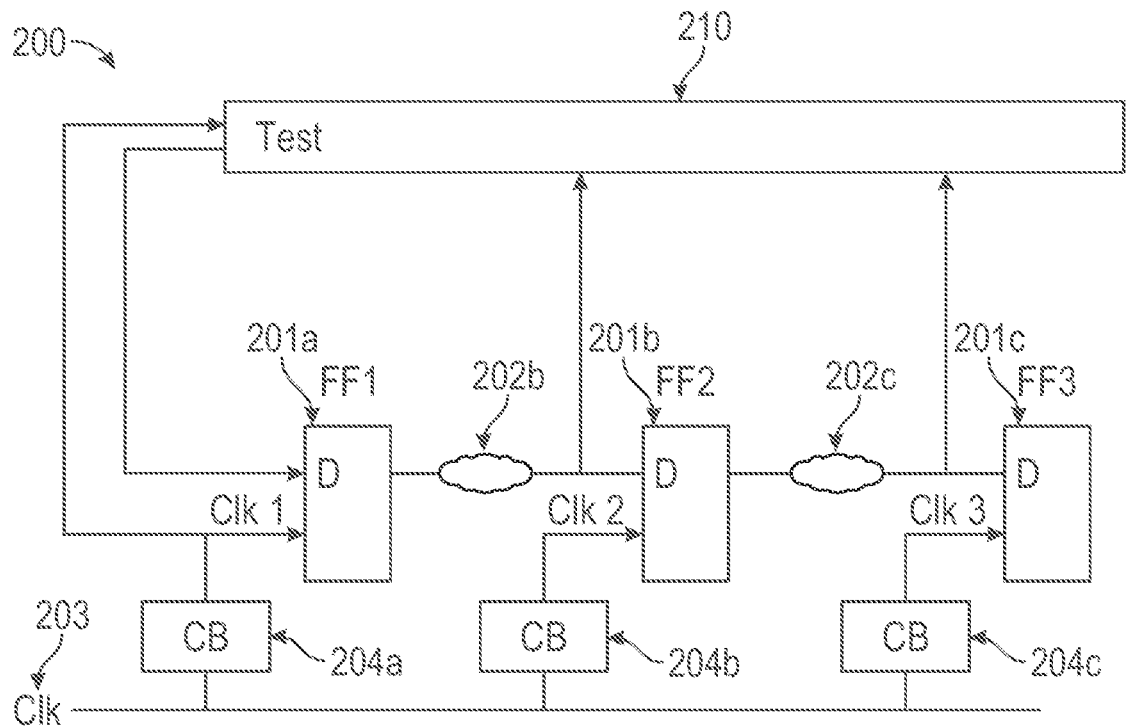
FIG. 2 is an illustration of a circuit with controllable clock delay, according to examples of the present disclosure.

FIG. 2 is an illustration of a circuit with controllable clock delay, according to examples of the present disclosure. This diagram illustrates a 1-bit execution pipeline. Circuit 200 includes flip-flops 201 (illustrated respectively as flip-flops 201a, 201b, and 201c), functional circuits 202 (illustrated respectively as functional circuits 202b and 202c), master clock signal line 203, and controllable clock buffers 204 (illustrated respectively as controllable clock buffers 204a, 204b, and 204c). Circuit 200 also includes test circuit providing an input to flip-flop 201a and observation of the output of functional circuits 202b and 202c. Flip-fops 201a—c are clocked with signal lines labeled CLK1, CLK2, and CLK3, respectively, which are driven by clock buffers 204a—c. Test circuit 210 provides a test input to flip-flop 201a at the start of the test and observes the output of functional circuit 202b. If the output of functional circuit 202b changes too slowly to be captured by flip-flop 201b, test circuit 210 may decrease the delay value for clock buffer 204a or may increase the delay value for clock buffer 204b or may do both. If the output of functional circuit 202b changes too quickly and prevents capture of the previous value by flip-flop 201b (i.e., violates the minimum hold time of flip-flop 201b) the part may be downrated or marked to be unfixable. A downrated part is designated to operate at a lower maximum frequency than other parts of the same design.

Figure 3:
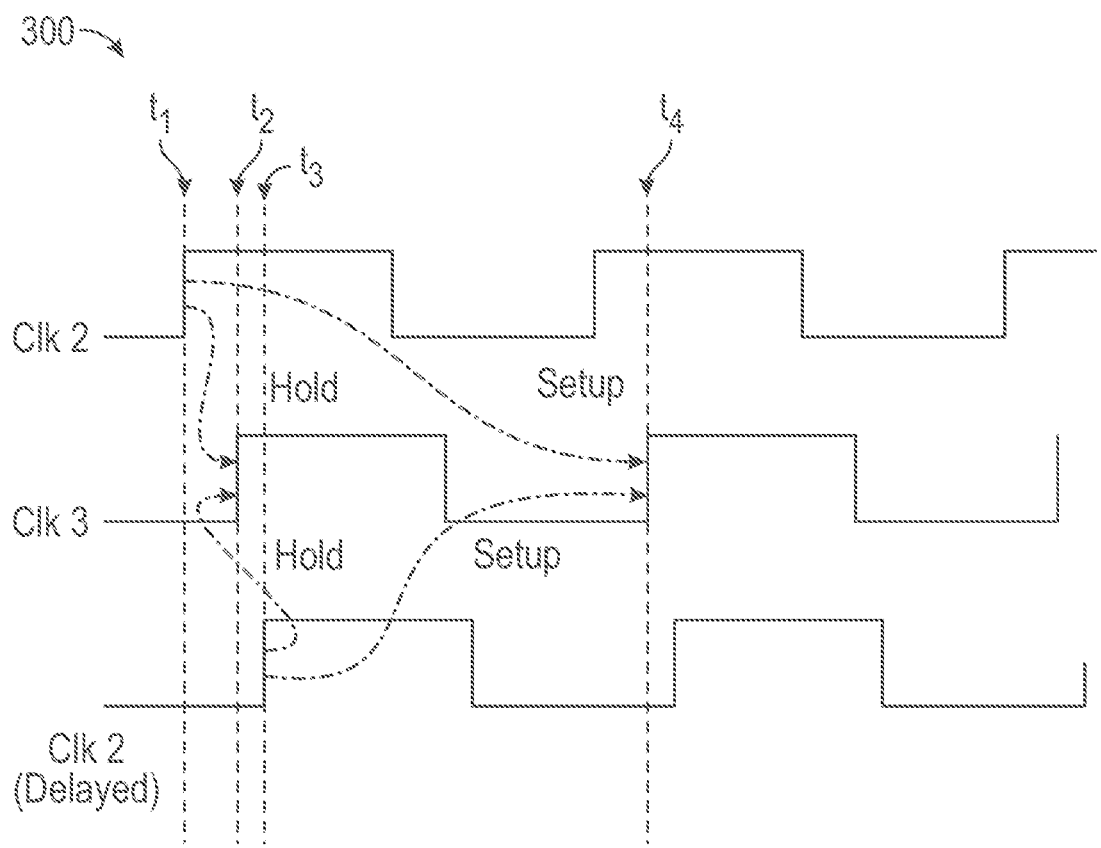
FIG. 3 is a timing diagram, according to examples of the present disclosure.

FIG. 3 is a timing diagram, according to examples of the present disclosure. Timing diagram 300 illustrates the waveform of CLK2, CLK3, and delayed CLK2 (illustrated as CLK2 (Delayed)). This diagram illustrates a scenario where the propagation time through functional circuit 202c is short enough to violate the hold time at flip-flop 201c. In other words, flip-flop 201c will capture the new data one clock cycle early instead of capturing it at $t_4$. If instead CLK2 is delayed until $t_3$ this hold violation will be prevented. However, the part must be further tested to also ensure delay of CLK2 does not violate the setup requirement at flip-flop 201c. If delaying CLK2 causes a setup violation, the part may be downgraded to a lower speed.

Figure 4A:
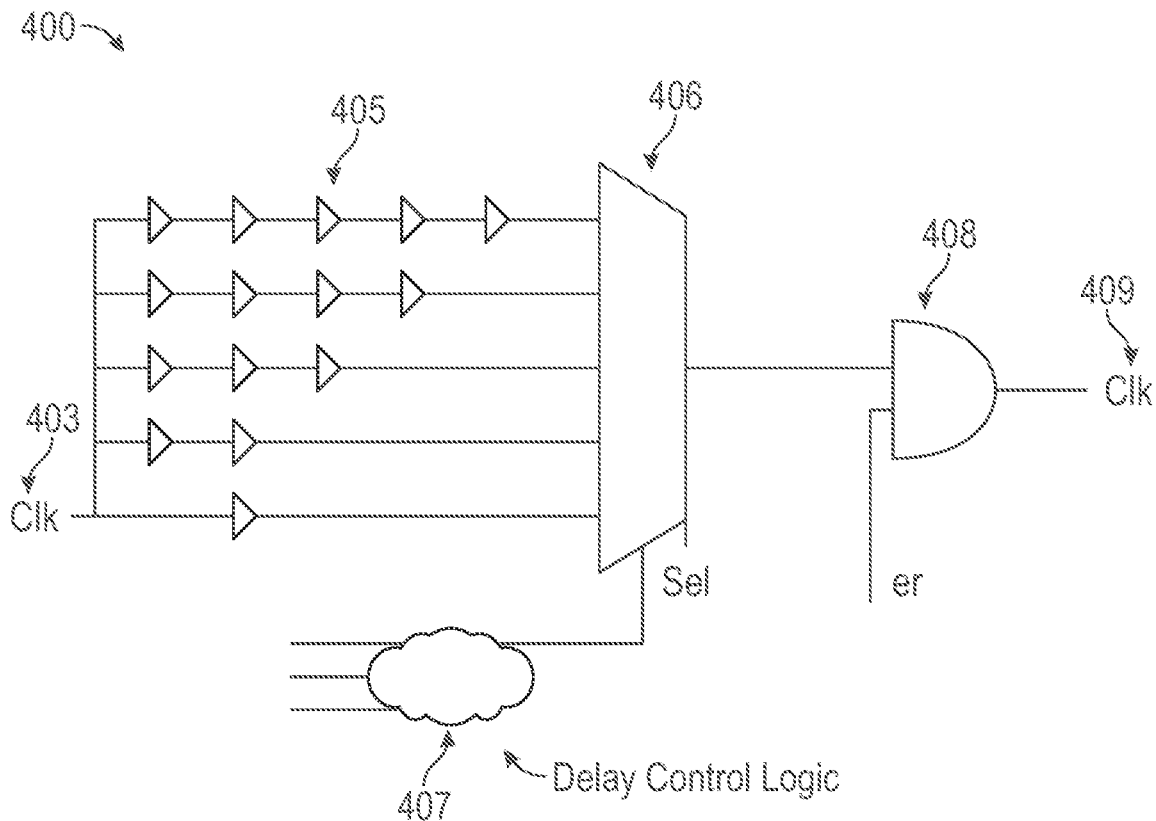
FIGS. 4a and 4b are illustrations of controllable clock delay buffer circuits, according to examples of the present disclosure.
Figure 4B:
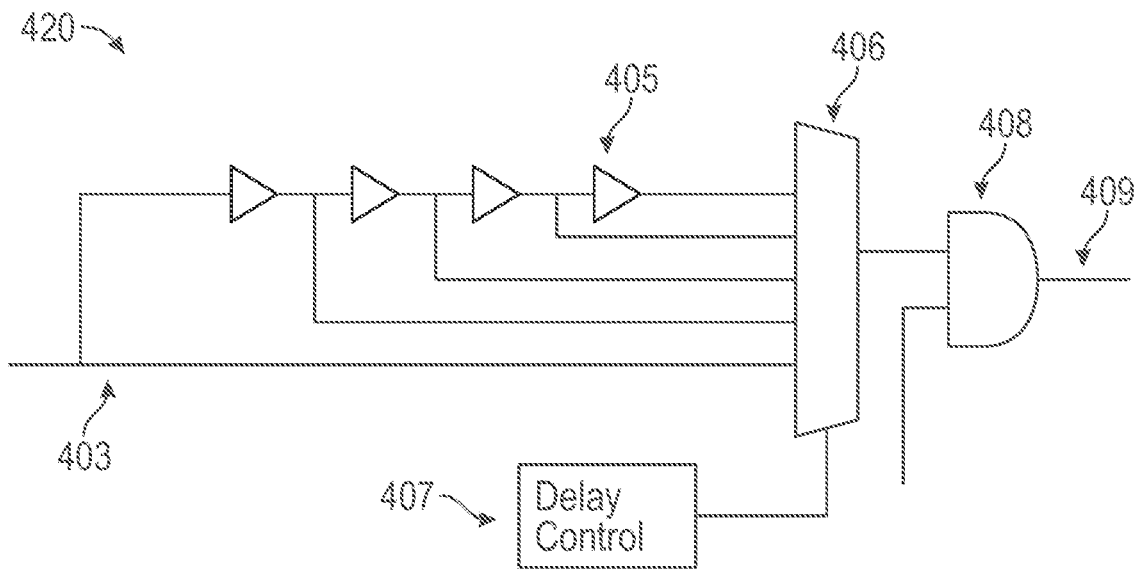

FIGS. 4a and 4b are illustrations of controllable clock delay buffer circuits, according to examples of the present disclosure. In FIG. 4a, delay selection circuit 400 includes master clock input 403, delay modules 405, delay selector 406, delay control logic 407, enable 408, and buffered clock output 409. Selector 406 includes inputs with increasing amounts of delay (i.e., increasing numbers of serially connected delay modules 405), from one delay module to x delay modules where x=5 in this example. Each delay module 405 introduces a single unit of delay. Master clock input 403 receives a master clock signal, for example, from a master clock distribution network. In some examples, delay selection circuit 400 may include a number of delay modules 405 and a selector 406 sized to select from many more inputs to provide an equal number of units of delay. Delay control logic 407 may read a fused memory location or a register value to determine which one of the inputs to selector 406 to select to pass as the output clock signal. Enable 408 will pass the selected clock signal when the enable input is asserted and the selected output clock signal will be output at clock signal 409. In order to add a unit of delay, delay control logic 407 may, for example, increment the register value and thereby change the selection input to selector 406 to select the next more delayed clock signal.

FIG. 4b illustrates another controllable clock buffer, according to examples of the present disclosure. FIG. 4b utilizes fewer delay blocks and may require less real estate in the circuit. In FIG. 4b circuit 420 includes master clock input 403, delay modules 405, selector 406, delay control logic 407, enable 408, and buffered clock output 409. Master clock input 403 is fed to a first input of selector 406 through a series connection of the delay modules 405. The output of respective ones of the delay modules 405 are tapped and fed to respective inputs of selector 406. Master clock input 403 is fed directly to a respective input of selector 406. The operation of delay control logic 407, enable 408, and buffered clock output 409 is as described above in relation to FIG. 4a. In this example, delay control 407 may select from zero to up to four units of delay. In some examples, delay selection circuit 420 may include a number of delay modules 405 and a selector 406 sized to select from many more inputs to provide an equal number of units of delay.

Figure 5:
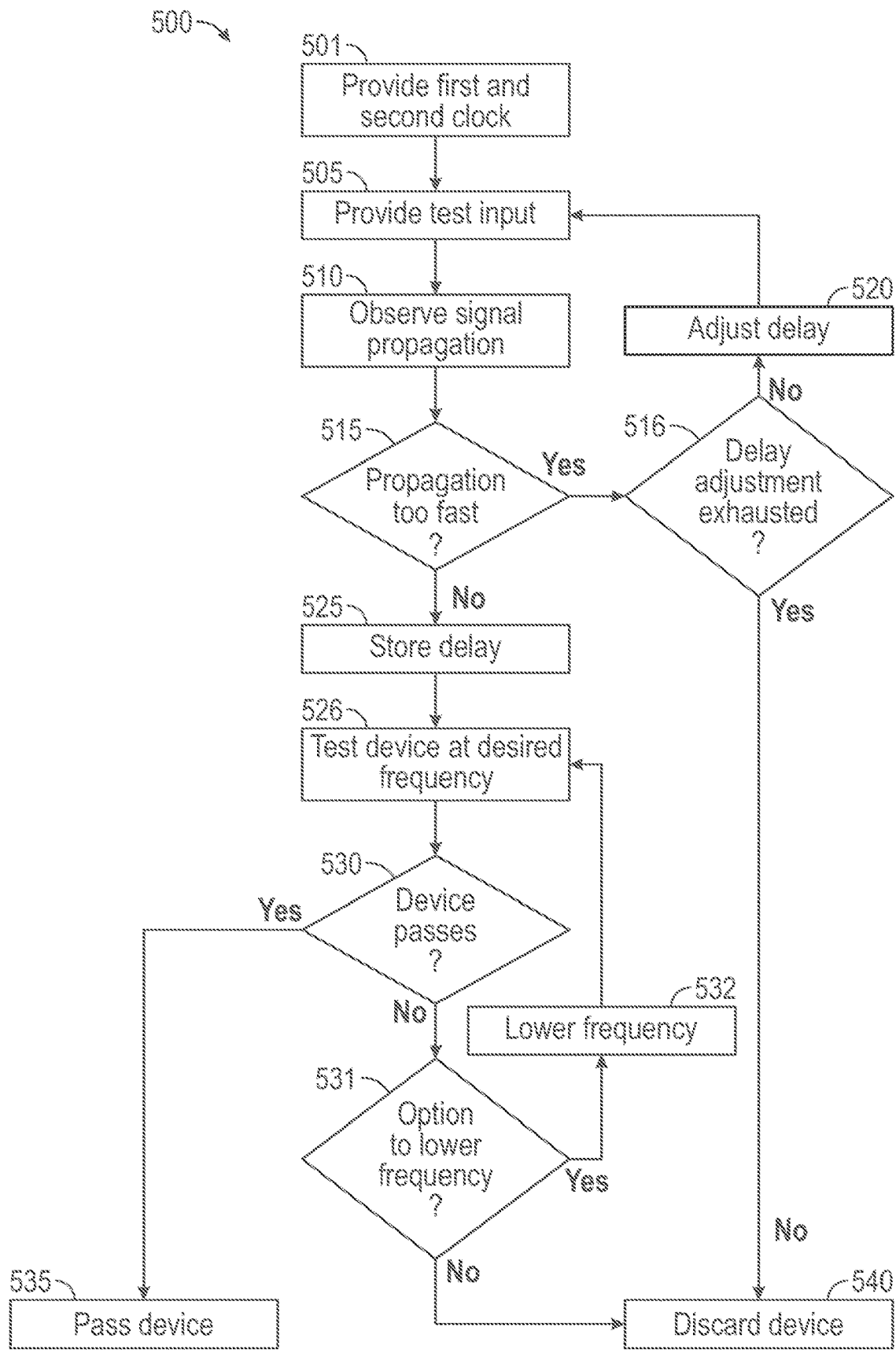
FIG. 5 is a flow chart of a method for correcting post fabrication timing errors, according to examples of the present disclosure.

FIG. 5 is a flow chart of a method for correcting post fabrication timing errors, according to examples of the present disclosure. The method may be performed to test and correct post fabrication timing errors in a pipelined processor. The method may be assisted by performing a static timing analysis on the design to identify critical timing paths through functional circuit stages between sets of flip-flops for capturing and propagating the pipeline state. Static analysis of the circuit may identify one or more fast paths through a pipeline stage that may result hold-time violations of the flip-flops at the output of that stage. Static analysis of the circuit may also identify one or more slow paths through a pipeline stage that may result in setup-time violations of the flip-flops at the output of that stage. This static analysis identification of fast and slow paths may be used to generate test inputs that trigger or isolate these paths. Method 500 begins with providing a first clock signal to a first flip-flop in a data path and a second clock to a second flip-flop in the data path where a function block connects the outputs of the first flip-flop and the inputs of the second-flip flop. In some examples, the first and second clock signals are provided with a mid-point delay amount to allow shifting each clock left (less delay) or right (more delay). At block 505, test circuitry provides a test input to the first flip-flop. In some embodiments, test circuitry at block 505 observes and records an input read from a memory coupled to the bus interface unit (e.g., an instruction and/or operand fetched from that memory). At block 510, test circuitry observes the signal propagation through the function block. At block 515, test circuitry determines whether propagation was too fast to be acquired properly by the second flip-flop. This may be determined, for example, by observing the output of the second flip-flop. If the propagation was too fast at block 516 the test circuitry determines whether additional delay adjustments are possible. If all adjustments have been exhausted, the test circuit marks the device to be discarded at block 540. If further adjustments are possible, at block 520 the delay control logic increases the timing separation in response to determining that the signal propagation time is less than the minimum hold time of the second flip-flop by adding a unit of delay to the first clock signal or subtracting a unit of delay from the second clock signal. Delay control logic Delay may be added/subtracted in single unit increments, e.g., by selecting a path through one more or one fewer delay module 405, in some examples. In some examples, the second clock signal may be advanced by a single unit increment, e.g., adding a single delay module 405 into the path of the second clock signal, rather than delaying the first clock signal.

If after adjusting the clock delay all applicable tests are passing, the adjusted settings of delay for each controllable buffer is stored at block 525. In some examples, the self-test process may be repeated at some interval to make adjustments as environmental conditions change or aging effect, such as electromigration, occur. For example, the temperature may change over time and impact the propagation time. In some examples, delay values may be stored in registers to allow for adjustments over time. In some examples, the delay amounts may be stored permanently in the circuit by, for example, burning fuses in the chip. The permanently stored values may drive the clock buffers directly or may be read into registers at initialization. In some examples, delay amounts may be read into registers at initialization and further adjusted using method 500. The further adjustments may be stored in a nonvolatile memory by burning additional fuses. In some examples, the nonvolatile memory is a set of flash memory cells.

Shifting the clock delays to fix a hold violation, however, can introduce a set-up violation elsewhere in the design. Therefore, at block 526, the circuit tested at the desired max frequency to determine whether the timing remains correct. At block 530, if the circuit passes these tests then the part may be can be marked "good" and passed at block 535. At block 531, if fixing the hold violation introduced a setup violation then the circuit may, optionally, be down rated to a lower frequency. If down rating is acceptable, then the target frequency is lowered in block 532 and the part is retested at this frequency. This process continues until the device passes (535) or the lowest acceptable target frequency is not met and the part is discarded (540).

Figure 6:
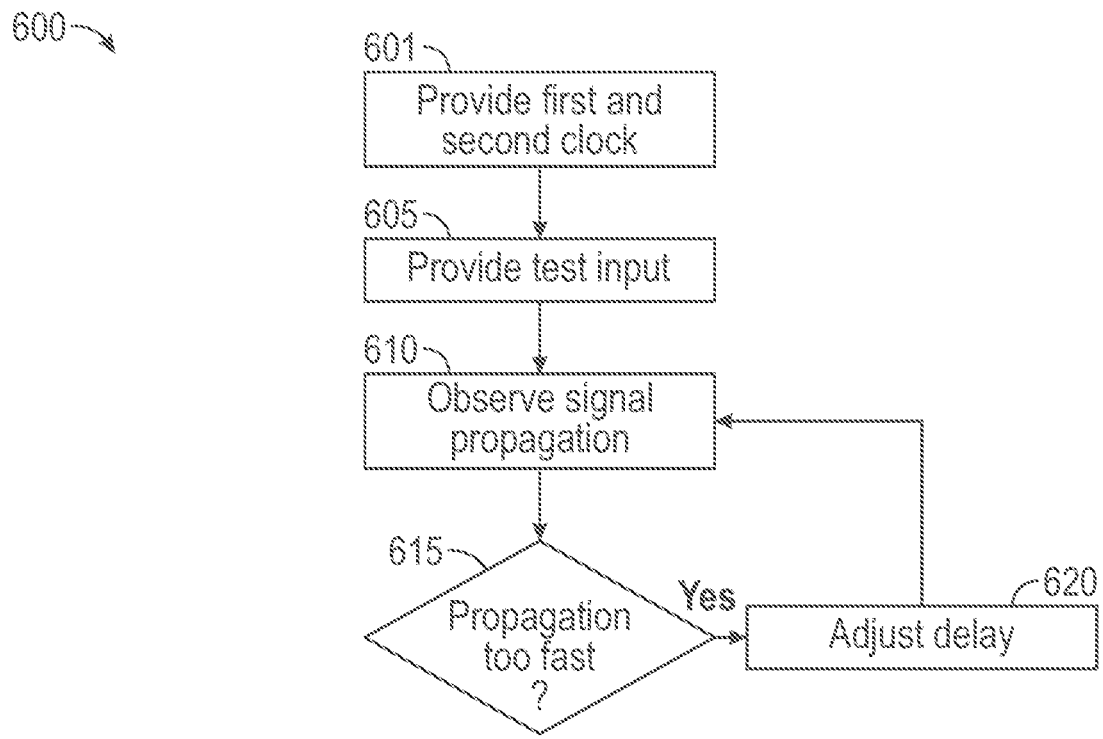
FIG. 6 is a flow chart of a method for correcting post fabrication timing errors, according to examples of the present disclosure.

FIG. 6 is a flow chart of a method for correcting post fabrication timing errors, according to examples of the present disclosure. Method 600 begins with providing a first clock signal to a first flip-flop in a data path and a second clock to a second flip-flop in the data path where a function block connects the outputs of the first flip-flop and the inputs of the second-flip flop. In some examples, the first and second clock signals are provided with a mid-point delay amount to allow shifting each clock left (less delay) or right (more delay). At block 605, test circuitry provides (or in some examples observes and records) a test input to the first flip-flop. At block 610, test circuitry observes the signal propagation through the function block. The test circuitry may operate at a substantially higher clock rate than the first and second clock signals. In some examples, test circuitry may sample twice in succession. At block 615, test circuitry determines whether the output of the function block changed before the end of the minimum hold time of the second flip-flop. If yes, at block 620 the delay control logic adds delay to the first clock signal. Delay may be added in single unit increments, e.g., adding a single delay module 405 to the clock path, in some examples. In some examples, the second clock signal may be advanced by a single unit increment, e.g., by removing a single delay module 405 from the clock path, rather than delaying the first clock signal.

Figure 7:
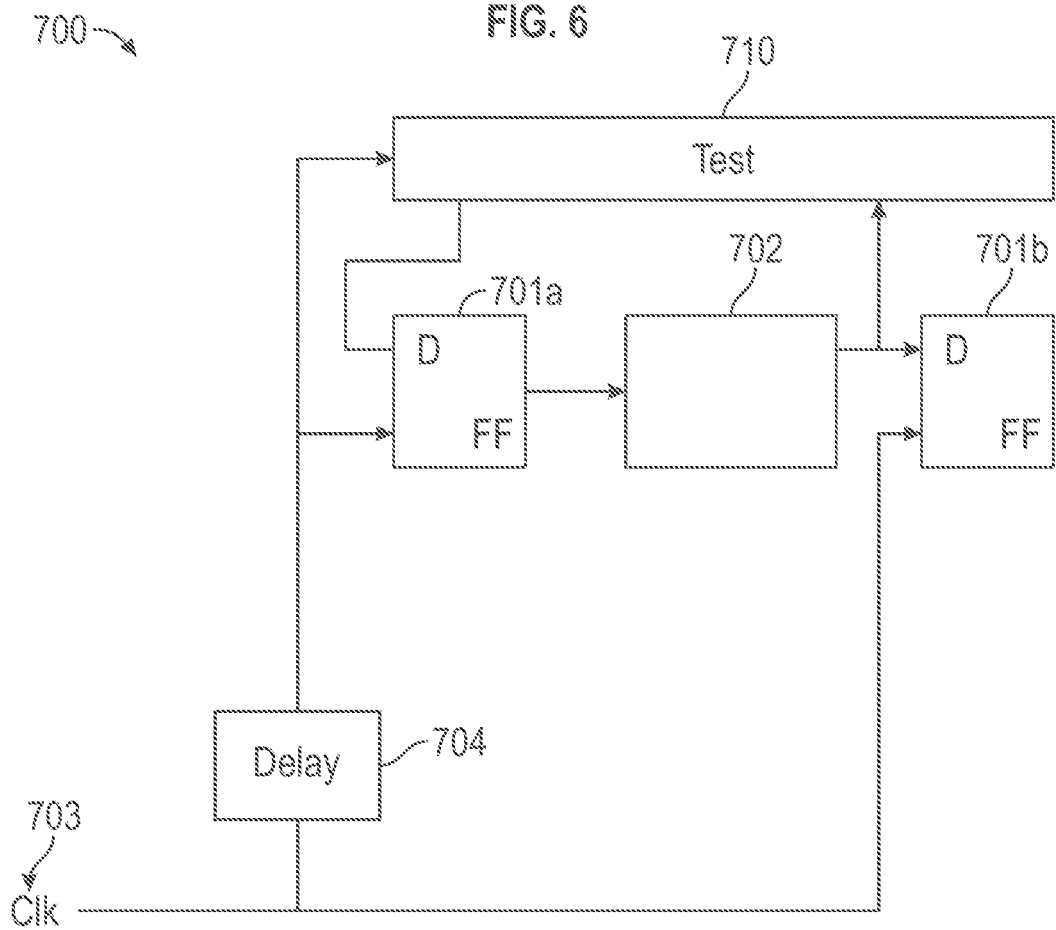
FIG. 7 is an illustration of an integrated circuit with controllable clock delay, according to examples of the present disclosure.

FIG. 7 is an illustration of a circuit with controllable clock delay, according to examples of the present disclosure. Circuit 700 includes flip-flops 701a and 701b, functional circuit 702, master clock input line 703 (which receives a master clock signal), and clock buffer 704. Circuit 700 also includes test circuit providing an input to flip-flop 701a and observing an output of functional circuit 702. The input to flip-flip 701a may flow through other circuits before arriving at flip-flop 701a. Flip-flop 701a is clocked by clock buffer 704 and flip-flop 701b is clocked by the master clock signal received at master clock input line 703. Test circuit 710 provides a test input to flip-flop 701a at the start of the test and observes the output of functional circuit 702. If the output of functional circuit 702 changes too slowly to be captured by flip-flop 701b, test circuit 710 may decrease the delay value for clock buffer 704. If the output of functional circuit 702 changes too fast to be captured by flip-flop 701b, test circuit 710 may increase the delay value for clock buffer 704.

Figure 8:
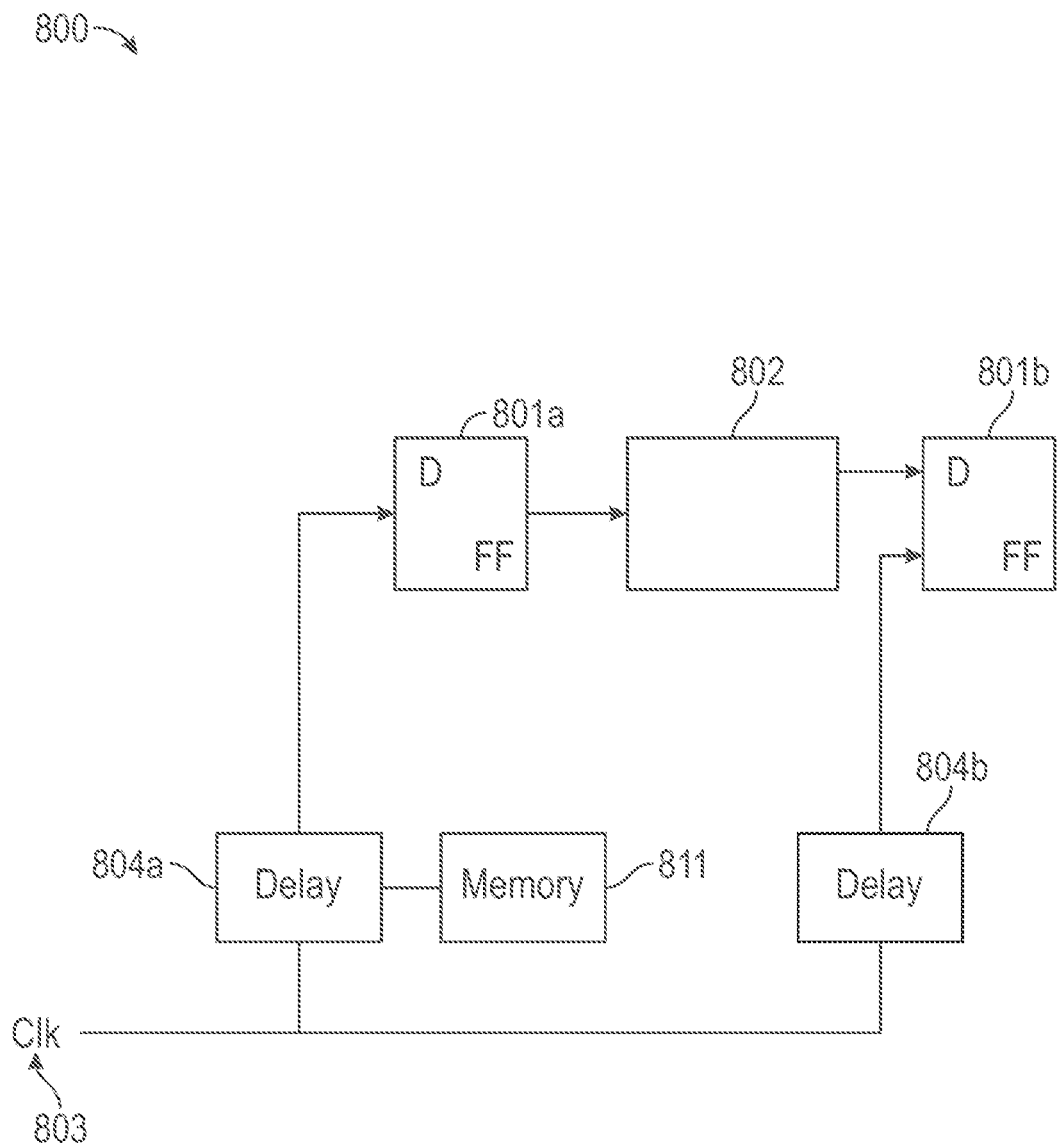
FIG. 8 is an illustration of an integrated circuit with controllable clock delay, according to examples of the present disclosure.

FIG. 8 is an illustration of a circuit with controllable clock delay, according to examples of the present disclosure. Circuit 800 includes flip-flops 801a and 801b, functional circuit 802, master clock input line 803 (which receives a master clock signal), and clock buffers 804a and 804b. Flip-flop 801a is clocked by clock buffer 804a and flip-flop 801b is clocked by clock buffer 80 clock buffer 804b. If the output of functional circuit 802 changes too slowly to be captured by flip-flop 801b, a tester can decrease the delay value for clock buffer 804. Circuit 800 also includes non-transitory memory 811 to store a delay value. In some examples, memory 811 is a set of fuses to form a non-volatile memory. In some examples, memory 811 is a register that may be modified by test circuit 810 to adjust the delay of clock buffer 804. During operation, the delay value for clock buffer 804 is responsive to the delay value stored in non-transitory memory 811.

Figure 9:
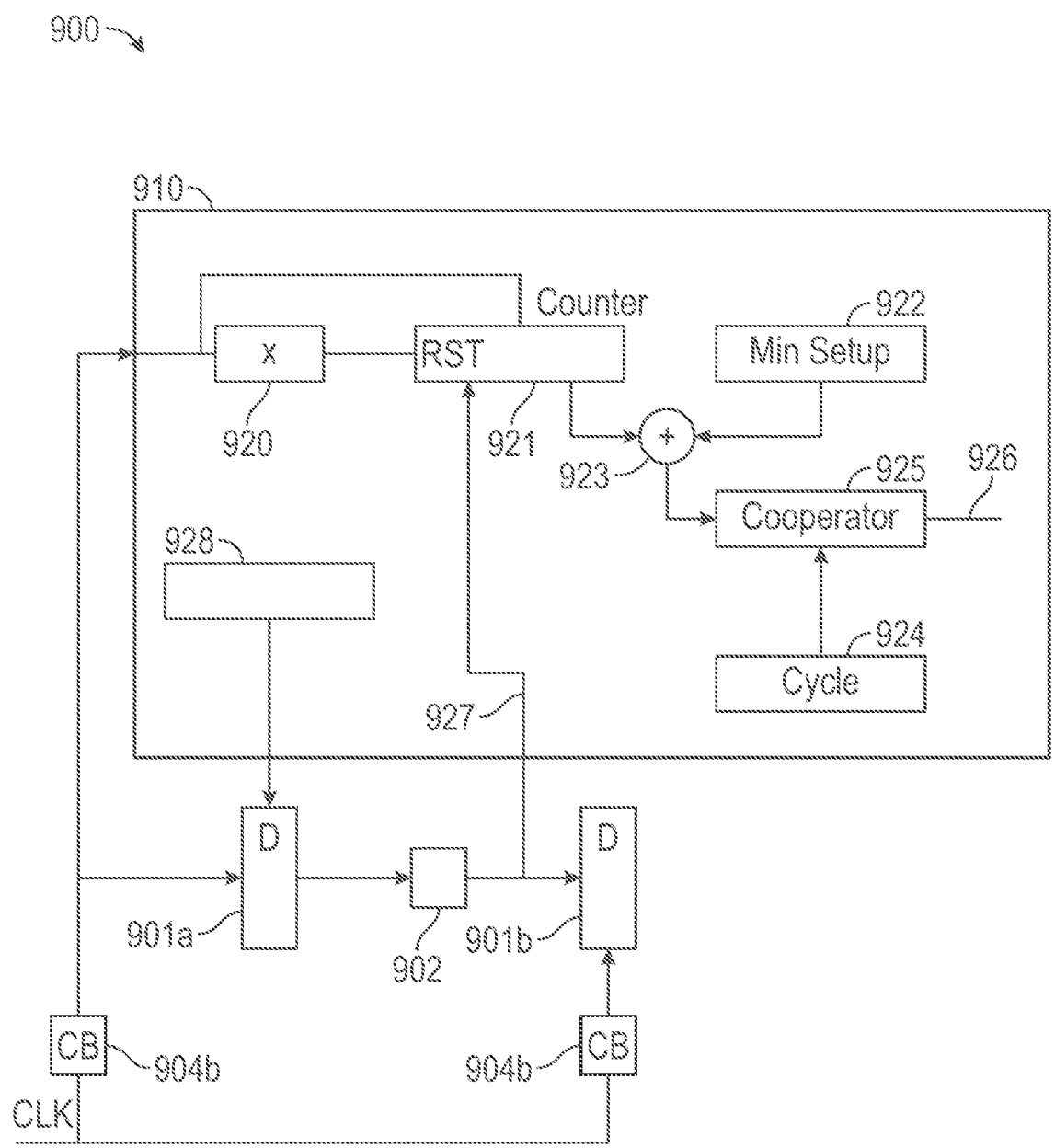
FIG. 9 is an illustration of an integrated circuit with controllable clock delay, according to examples of the present disclosure.

FIG. 9 is an illustration of a circuit with controllable clock delay, according to examples of the present disclosure. Circuit 900 includes flip-flops 901a and 901b, functional circuit 902, master clock input line 903 (which, and clock buffers 904a and 904b. Circuit 900 also includes test circuit providing an input to flip-flop 901a and observation of the output of function block 902. The input to flip-flip 901a may flow through other circuits before arriving at flip-flop 901a. Flip-flop 901a is clocked by clock buffer 904a and flip-flop 901b is clocked by clock buffer 904b. Test circuit 910 provides a test input to flip-flop 901a at the start of the test and observes the output of functional circuit 902. If the output of functional circuit 902 changes too slowly to be captured by flip-flop 901b, test circuit 910 may decrease the delay value for clock buffer 904a or 904b.

In one example, test circuit 910 includes clock multiplier 920, counter 921, minimum setup value 922, adder 923, cycle time value 924, comparator 925, indicator 926, observation input 927, and test case 928. Clock multiplier 920 may be a PLL or other clock multiplier to generate a higher frequency clock to use as a timer, and may receive the output of clock buffer 904a as input. In some examples, clock multiplier 920 may be external to the integrated circuit. Counter 921 may be a digital counter configured to reset on a clock trigger from clock buffer 904a and count until observation input 927 changes. Minimum setup value 922 may be a representation of the minimum setup time for flip-flop 901b. Adder 923 may be a digital adder. Cycle time value 924 may be a representation of the master clock cycle time. Comparator 925 may be a digital comparator driving signal 926 to signal an unfixable condition.

In operation, test case 928 provides an input to flip-flop 901a, and counter 921 begins multiplied counting clock cycles, provided by clock multiplier 920, responsive to a predetermined edge of a clock signal provided by clock buffer 904a. When observation input 927 changes value, counter 921 stops counting, and its output, added to minimum setup value 922 is compared to by comparator 925 with cycle time value 924. In the event that the output of counter 921 plus minimum setup value 922 is less than cycle time value 924, comparator 925 does not indicate an unfixable condition. In the event that the output of counter 921 plus minimum setup value 922 is not less than cycle time value 924, comparator 925 indicates an unfixable condition.

Although example embodiments have been described above, other variations and embodiments may be made from this disclosure without departing from the spirit and scope of these embodiments.

What is claimed is:

1. A method of testing an integrated circuit comprising:
providing a first clock signal to a first flip-flop, the first flip-flop with an output to a functional circuit,
providing a second clock signal to a second flip-flop, the second flip-flop with an input from the functional circuit, wherein the second flip-flop has a minimum hold time,
providing a test input to the first flip-flop,
observing a signal propagation time through the functional circuit,
determining the signal propagation time is less than the minimum hold time of the second flip-flop, and
increasing a timing separation in response to the determining that the signal propagation time is less than the minimum hold time of the second flip-flop by adding a unit of delay to the first clock signal or subtracting a unit of delay from the second clock signal.

2. The method of claim 1, comprising, after adding the unit of delay to the first clock signal:
observing a second time the signal propagation time through the functional circuit,
determining the second signal propagation delay is less than the minimum hold time of the second flip-flop, and
adding a second unit of delay to the first clock signal.

3. The method of claim 1, comprising:
determining the timing separation cannot be increased further, and
marking the integrated circuit to be discarded.

4. The method of claim 1, compromising:
storing the unit of delay in a nonvolatile memory.

5. The method of claim 1 wherein the functional circuit is a combinational logic path through a pipeline stage of a processor, comprising:
conducting a static timing analysis of the pipeline stage and identifying the functional circuit as having the fastest signal propagation time of any path through the pipeline stage.

6. The method of claim 1, comprising:
generating a first delayed clock signal by passing a master clock signal through a first delay circuit, and
generating a second delayed clock signal by passing a master clock signal through a second delay circuit,
wherein adding a unit of delay to the first clock signal includes selecting the first delayed clock signal as the first clock signal.

7. The method of claim 1, wherein the second flip-flop has a minimum setup time, the method comprising:
after increasing the timing separation, observing a setup violation in the second flip-flop, and
downgrading a maximum frequency of the integrated circuit.

8. A system for testing an integrated circuit comprising:
a first clock signal line to a first flip-flop having an output to a functional circuit,
a second clock signal to a second flip-flop with an input from the function, wherein the second flip-flip has a minimum hold time,
a test circuit coupled to an input of the first flip-flop and the output of the functional circuit to determine if a signal has propagated through the function in a first propagation time that is less than the minimum hold time of the second flip-flop,
a first delay selection circuit coupled between a master clock signal line and the first clock signal line to selectively add or subtract a unit of delay, and
a second delay selection circuit coupled between a master clock signal line and the second clock signal line.

9. The system of claim 8, wherein the delay selection circuit to selectively add two units of delay to the first clock signal.

10. The system of claim 8, the test circuit comprising:
a timer having a start input coupled to the first clock signal line and a stop input coupled to the output of the functional circuit.

11. The system of claim 8, comprising a nonvolatile memory coupled to the delay selection circuit to store a unit delay count.

12. The system of claim 8, wherein the functional circuit is a combinational logic path through a pipeline stage of a processor.

13. The system of claim 8, the delay selection circuit comprising:
a one-unit clock delay buffer coupled to the master clock signal line,
a two-unit clock delay buffer coupled to the master clock signal line, and
a selector with an output coupled to the first clock signal line and a plurality of inputs coupled to each of the master clock signal, an output of the one-unit clock delay buffer, and an output of the two-unit clock delay buffer.

14. The system of claim 8, the test circuit comprising:
a timer to determine a signal propagation delay,
an adder to add a minimum setup time of the second flip-flop, and
a comparator to signal an unfixable condition when the signal propagation delay plus the minimum setup time of the second flip-flop is greater than a cycle time of a clock signal on the second clock line.

15. An integrated circuit comprising:
a first clock signal line to a first flip-flop having an output to a functional circuit,
a second clock signal to a second flip-flop with an input from the function, wherein the second flip-flip has a minimum hold time,
a nontransitory memory to store a delay quantity,
a first delay circuit coupling a master clock signal line to the first clock signal line to produce a first clock signal by delaying the master clock signal an amount specified by the delay quantity, and
a second delay circuit coupling a master clock signal line to the second clock signal line.

16. The integrated circuit of claim 15, wherein the nontransitory memory is nonvolatile.

17. The integrated circuit of claim 15, wherein the functional circuit is a combinational logic path through a pipeline stage of a processor.

18. The integrated circuit of claim 17, comprising a delay selection circuit coupled between the master clock signal line and the clock signal line at each pipeline stage of the processor.

19. The integrated circuit of claim 15, the first delay circuit comprising:
a one-unit clock delay buffer coupled to the master clock signal line,
a two-unit clock delay buffer coupled to the master clock signal line, and
a selector with an output coupled to the first clock signal line and a plurality of inputs coupled to each of the master clock signal, an output of the one-unit clock delay buffer, and an output of the two-unit clock delay buffer.

20. The integrated circuit of claim 15, the delay circuit comprising:
a first clock delay buffer coupled to the master clock signal line and an intermediate line,
a second clock delay buffer coupled to the first intermediate line and a second line, and
a selector with an output coupled to the first clock signal line and a first input coupled to the master clock signal line, a second input coupled to the intermediate line, and a third input coupled to the second line.

* * * * *